(12) United States Patent
Sarraf

(10) Patent No.: US 9,049,779 B2
(45) Date of Patent: Jun. 2, 2015

(54) ELECTRICAL COMPONENTS AND METHODS OF MANUFACTURING ELECTRICAL COMPONENTS

(71) Applicant: Tyco Electronics Corporation, Berwyn, PA (US)

(72) Inventor: David Bruce Sarraf, Elizabethtown, PA (US)

(73) Assignee: TYCO ELECTRONICS CORPORATION, Berwyn, PA (US)

( * ) Notice: Subject to any disclaimer, the term of this patent is extended or adjusted under 35 U.S.C. 154(b) by 100 days.

(21) Appl. No.: 13/686,471

(22) Filed: Nov. 27, 2012

(65) Prior Publication Data

US 2014/0144674 A1  May 29, 2014

(51) Int. Cl.
| | |
|---|---|
| H05K 3/02 | (2006.01) |
| H05K 1/02 | (2006.01) |
| C23C 18/16 | (2006.01) |
| H01Q 1/36 | (2006.01) |
| H05K 3/24 | (2006.01) |
| H01Q 1/38 | (2006.01) |
| H01Q 7/00 | (2006.01) |
| H05K 1/16 | (2006.01) |
| H05K 3/04 | (2006.01) |

(52) U.S. Cl.
CPC ............... *H05K 3/02* (2013.01); *H05K 1/0296* (2013.01); *C23C 18/1653* (2013.01); *H01Q 1/36* (2013.01); *H05K 1/16* (2013.01); *H05K 3/048* (2013.01); *H05K 3/242* (2013.01); *H05K 2201/10098* (2013.01); *H05K 2203/0769* (2013.01); *H01Q 1/38* (2013.01); *H01Q 7/00* (2013.01)

(58) Field of Classification Search
CPC ............ C23C 18/1603; C23C 18/1658; C23C 18/166; H05K 3/046; H05K 3/048; H05K 3/04; H05K 3/06; H05K 3/108; H05K 3/241; H05K 3/181; H05K 3/242
USPC ........... 174/250, 255–257, 261; 361/748, 751
See application file for complete search history.

(56) References Cited

U.S. PATENT DOCUMENTS

2007/0103379 A1* 5/2007 Garby et al. ................... 343/895
2008/0268280 A1* 10/2008 Cho et al. ...................... 428/615

FOREIGN PATENT DOCUMENTS

GB         1076156 A       7/1967

OTHER PUBLICATIONS

International Search Report, International Application No. PCT/US2013/070942, International Filing Date, Nov. 20, 2013.

* cited by examiner

*Primary Examiner* — Hoa C Nguyen
*Assistant Examiner* — Amol Patel

(57) ABSTRACT

An electrical component includes a substrate having a circuit area and a sacrificial area. A lift-off layer is deposited on the substrate in the sacrificial area. A seed layer is deposited on the substrate in the circuit area and on the lift-off layer in the sacrificial area. A plating layer is electrodeposited on the seed layer. The plating layer forms a circuit in the circuit area. The plating layer forms plating electrodes in the sacrificial area. The lift-off layer is removable from the substrate. The seed layer and the plating layer on the lift-off layer are removed with the lift-off layer when the lift-off layer is removed from the substrate, leaving the circuit on the substrate. The lift-off layer may be dissolved after the plating layer is formed, where the plating layer deposited on the lift-off layer is removed as the lift-off layer is dissolved.

20 Claims, 3 Drawing Sheets

ELECTRICAL COMPONENTS AND METHODS OF MANUFACTURING ELECTRICAL COMPONENTS

BACKGROUND OF THE INVENTION

The subject matter herein relates generally to electrical components and methods of manufacturing electrical components.

Electrical components, such as circuit boards and antennas are typically made by a subtractive process, where a copper sheet is applied to the substrate and a portion of the copper sheet is etched away to create the necessary circuit traces. Such a process is referred to as a subtractive process because copper is removed from the copper sheet applied to the substrate via etching or machining to achieve the circuit trace geometry. Typically, a solder mask is placed on top of the traces. Circuit boards manufactured by a subtractive process are not without disadvantages. For instance, every time a new geometry or circuit is required, a photo-resist etch plate needs to be created. This requires time and money investment before the circuit geometry can be made.

Some circuit boards manufacturing processes have been developed that use an additive process where a seed layer of conductive ink is deposited on a substrate and the seed layer is plated. The plating may be performed by either an electroless plating process or by an electroplating process. Both processes have drawbacks and create problems.

Electroless copper plating has a slow deposition rate. Another problem with electroless copper plating is that such plating is typically performed in a bath having a high pH, which degrades the binder in the conductive ink of the seed layer, which results in a reduction in the adhesion of the seed ink to the substrate and consequently the adhesion of the circuit to the substrate. Degradation is exacerbated by the low deposition rates, which require the circuit board to be immersed in the bath for a long period of time.

Electrolytic plating is an acid-based process which does not degrade the ink and is quicker than electroless plating, however electrolytic plating introduces its own problems. For example, electrolytic plating requires an electrical contact with the seed layer to provide a path for the electrical current needed for plating. The contact can be an auxiliary conductor that brings the current from the circuit pattern to an edge of the circuit board. Such auxiliary conductors may be problematic to the operation of the component. For example, for an antenna, the auxiliary conductor affects the antenna properties of the designed antenna pattern. In such cases, the auxiliary conductor needs to be removed, which is difficult. Additionally, with electroplating, the terminal effect results in the plated deposit building thicker and more quickly in the region nearest the auxiliary conductor. The buildup affects the edges of the pattern as well as the thickness, which can result in changes in the intended spacing of the conductors of the circuit and can affect antenna performance.

A need remains for an electrical component that can be manufactured by an additive process quickly and without the problems of conductor adhesion to the substrate.

BRIEF DESCRIPTION OF THE INVENTION

In one embodiment, an electrical component is provided including a substrate having a circuit area and a sacrificial area. A lift-off layer is deposited on the substrate in the sacrificial area. A seed layer is deposited on the substrate in the circuit area and is deposited on the lift-off layer in the sacrificial area. A plating layer is electrodeposited on the seed layer. The plating layer forms a circuit in the circuit area. The plating layer forms plating electrodes on the lift-off layer in the sacrificial area. The lift-off layer is removable from the substrate. The seed layer and the plating layer on the lift-off layer are removed with the lift-off layer when the lift-off layer is removed from the substrate, leaving the circuit on the substrate. The lift-off layer may be dissolved after the plating layer is formed, where the plating layer deposited on the lift-off layer is removed as the lift-off layer is dissolved.

Optionally, the lift-off layer may be an etch stop material configured to be removed in an alkaline bath. The plating layer may be laser cut along the interface between the circuit area and the sacrificial area prior to removal to the lift-off layer to form a clean break of the plating layer at such interface, The lift-off layer may be printed on the substrate. The seed layer may be printed on the lift-off layer and on the substrate. The plating layer may be plated on the seed layer in an electrolytic bath.

Optionally, the circuit may form an antenna on the substrate. The seed layer may be deposited in concentric loops or flat spirals. The seed layer may have shorting paths between the concentric loops or between the turns of the spirals. The plating layer may be deposited on the shorting paths to form shorting bars during electroplating. The shorting bars may be removed after the plating layer is deposited on the seed layer.

In another embodiment, a method of manufacturing an electrical component is provided that includes providing a substrate having a circuit area and a sacrificial area, depositing a lift-off layer on the substrate in the sacrificial area, depositing a seed layer on the lift-off layer in the sacrificial area, depositing a seed layer on the substrate in the circuit area and plating a plating layer on the seed layer in the sacrificial area and the circuit area. The method includes removing the lift-off layer and the plating layer on the lift-off layer without removing the plating layer in the circuit area.

Optionally, depositing a lift-off layer may include depositing an etch stop material on the substrate in the sacrificial area. Depositing a lift-off layer may include printing the lift-off layer on the substrate. Depositing a seed layer may include printing the seed layer.

Optionally, removing the lift-off layer may include applying an alkali solution to the lift-off layer to dissolve the lift-off layer. Removing the lift-off layer may include bathing the electrical component in an alkali bath, where the alkali bath dissolves the lift-off layer to remove the plating layer on the lift-off layer.

Plating a plating layer may include electroplating the plating layer in an electrolytic bath. The method may include cutting the plating layer at an interface between the circuit area and the sacrificial area. Cutting the plating layer may include laser cutting the plating layer.

Optionally, depositing a seed layer in the circuit area may include depositing the seed layer in concentric loops or flat spirals with shorting paths between the loops or spirals. Plating the plating layer may include plating the loops and the shorting paths to form shorting bars. The method may include removing the shorting bars.

DETAILED DESCRIPTION OF THE INVENTION

Figure 1:
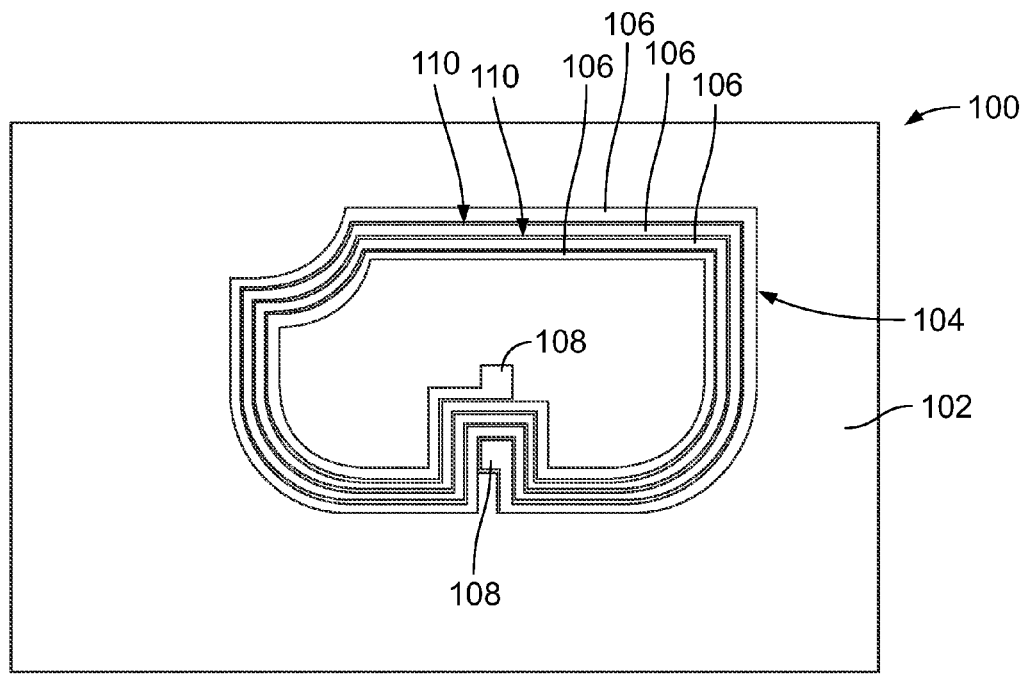
FIG. 1 an electrical component formed in accordance with an exemplary embodiment.

FIG. 1 illustrates an electrical component 100 formed in an accordance with an exemplary embodiment. The electrical component 100 includes a substrate 102 and a circuit 104 formed on the substrate 102. The circuit 104 includes one or more conductive traces 106 and one or more conductive pads 108 electrically connected to corresponding conductive traces 106. Components may be terminated to the conductive pad 108, such as electronic devices and/or wires. The wires or electronics may be soldered to the conductive pads 108.

In an exemplary embodiment, the electrical component 100 may be an antenna having the conductive traces 106 arranged in an antenna pattern. For example, the conductive traces 106 may form loops 110. For example, the conductive traces 106 may be concentric loops or the conductive traces 106 may form flat spirals of a spiral inductor. Alternatively, the conductive traces may form another pattern, which may be an antenna pattern. In alternative embodiments, the electrical component 100 may be another type of component, such as a circuit board.

In an exemplary embodiment, the circuit 104 is formed by an additive or build up process rather than a subtractive process. For example, the circuit 104 may be formed by printing a seed layer on the substrate 102 and then plating the seed layer to form the conductive traces 106, as compared to subtractive processes, such as chemical etching processes. In an exemplary embodiment, the conductive traces 106 are formed by an electroplating process, which is much quicker than an electroless plating process.

Figure 2:
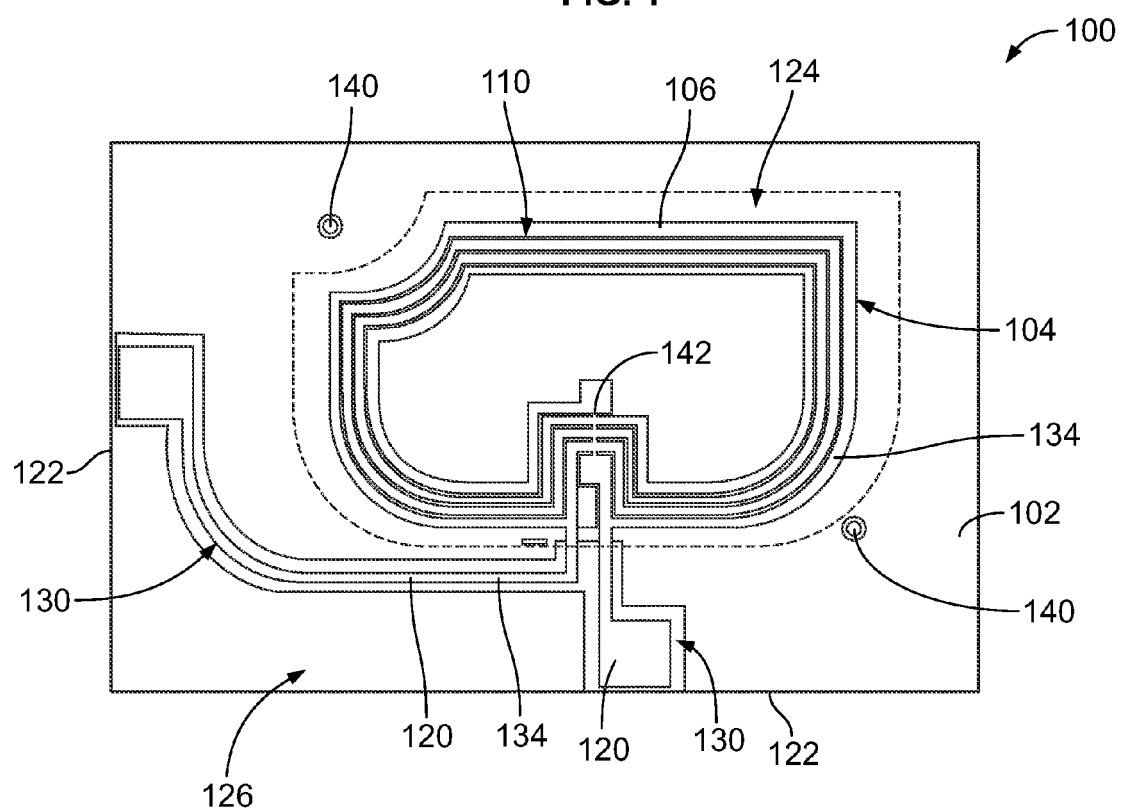
FIG. 2 illustrates the electrical component during manufacture.

FIG. 2 illustrates the electrical component 100 during manufacture. The electrical component 100 includes plating electrodes 120 connected to the conductive traces 106. The plating electrodes 120 are used during the electrode plating process. The plating electrodes 120 provide a path for electrical current needed for plating the conductive traces 106 during the electroplating process. The plating electrodes 120 are sacrificial and are later removed from the substrate 102, such that the plating electrodes 120 do not affect the electrical performance of the electrical component 100. For example, when the electrical component 100 is an antenna, the plating electrodes 120 may cause electrical interference or may affect the antenna characteristics of the electrical component 100. As such, the plating electrodes 120 are removed.

In the illustrated embodiment, two plating electrodes 120 are provided that are connected to corresponding loops 110 of the circuit 104. The plating electrodes 120 extend generally to an edge 122 of the substrate 102, where electrodes may be connected to the plating electrodes 120.

In an exemplary embodiment, the substrate 102 is divided into a circuit area 124 and a sacrificial area 126. The circuit 104 is formed in the circuit area 124. The plating electrodes 120 are formed in the sacrificial area 126. Optionally, the sacrificial area 126 may surround the circuit area 124. Optionally, the circuit area 124 may surround portions of the sacrificial area 126. For example, sacrificial area pockets may be defined within the circuit area 124.

The conductive traces 106 formed in the circuit area 124 remain on the substrate 102 to form the circuit 104. Conductive traces 106 formed in the sacrificial area 126 are later removed from the substrate 102. For example, the plating electrodes 120 are formed in the sacrificial area 126 and are configured to be later removed after the circuit 104 is formed.

Figure 3:
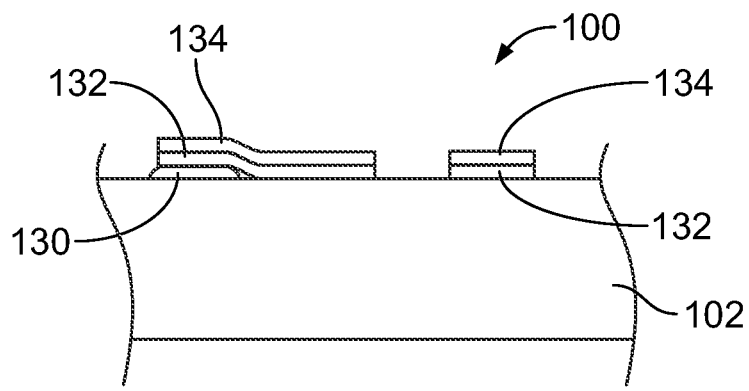
FIG. 3 is a cross sectional view of a portion of the electrical component.

FIG. 3 is a cross sectional view of a portion of the electrical component 100. During manufacture, a lift-off layer 130 is deposited on the substrate 102 in the sacrificial area 126 (shown in FIG. 1). The lift-off layer 130 may be selectively deposited on the substrate 102, such as in predetermined areas such as in areas where the plating electrodes 120 could be located. The lift-off layer 130 is a sacrificial layer that is configured to be removed from the substrate 102 during later manufacturing process. In an exemplary embodiment, the lift-off layer 130 is manufactured from a material formulated to be resistive to acids, such as those used in an electrolytic copper plating bath. The lift-off layer 130 may be made from a material formulated to dissolve readily when exposed to a certain chemical, such as in an alkali bath or when sprayed with an alkali spray. In an exemplary embodiment, the lift-off layer 130 may be an etch stop material. The lift-off layer may be printed on the substrate 102.

The electrical component 100 includes a seed layer 132 that is electrically conductive. In an exemplary embodiment, a portion of the seed layer 132 is deposited on the lift-off layer 130 and a portion of the seed layer 132 is deposited directly on the substrate 102, such as in the circuit area 124 (shown in FIG. 2). The seed layer 132 may be a conductive seed ink deposited in a predetermined pattern on the lift-off layer 130 and the substrate 102. In an exemplary embodiment, the seed layer 132 is printed on the lift-off layer 130 and the substrate 102. The seed layer 132 may be deposited by other application processes other than printing.

A plating layer 124 is electro deposited on the seed layer 132 during an electroplating process. The plating layer 134 is more highly conductive than the seed layer 132. The plating layer 134 may be a copper plating layer. The plating layer 134 may be other metals in an alternative embodiment. In an exemplary embodiment, during a post processing operation, the seed layer 132 and plating layer 134 on the lift-off layer 130 are later removed from the substrate 102.

Referring back to FIG. 2, during manufacture, the lift-off layer 130 is applied to the substrate 102 in the sacrificial areas 126 along a path desired for the plating electrodes 120. Optionally, the lift-off layer 130 may be deposited at other locations, such as at islands used to form registration marks 140. The lift-off layer 130 may be deposited on the substrate 102 by a printing process. Alternatively, the lift-off layer 130 may be deposited by other processes, such as a spraying process. Optionally, the lift-off layer 130 may be cured prior to depositing the seed layer 132 (shown in FIG. 3) on the lift-off layer 130. The lift-off layer 130 may be a paste or an epoxy applied to the substrate 102.

After the lift-off layer 130 is applied to the substrate 102, the seed layer 132 is applied to the substrate 102. The seed layer 132 is applied in a predetermined pattern that defines the circuit 104 and the plating electrodes 120. The seed layer 132 may be applied by a printing process, such as a pad printing process, an ink jet printing process, a screen printing process and the like. Electrodes are then connected to the seed layer 132 and the substrate 102 is immersed in an electrolytic plating bath. The plating layer 134 is formed on the seed layer 132 during an electroplating process. The seed layer 132 defines a conductive path for the electroplating process. The plating layer 134 forms the conductive traces 106 of the circuit 104.

In an exemplary embodiment, the seed layer 132 is deposited on the substrate 102 to form shorting paths between the loops 110. As the plating layer 134 builds up on the seed layer 132, shorting bars 142 are formed between the conductive traces 106 forming the loops 110. The shorting paths drive the current into each of the loops 110 to allow the plating layer 134 to form more quickly and more uniformly on each loop 110. The shorting bars 142 are configured to be later removed to electrically separate the loops 110 at the areas of the shorting bars 142. The seed layer 132 and the plating layer 134 may form the registration marks 140 during the plating processing.

The shorting bars 142 reduce terminal effect caused during the electroplating process. For example, because the plating layer 134 build quicker and thicker on the seed layer 132 in the regions nearest the plating electrodes 120, the shorting bars 142 take the current to each of the loops 110 generally concurrently allowing each of the loops 110 to build up simultaneously. The more rapid buildup forms the conductive traces 106 more uniformly such that each of the conductive traces 106 has a generally uniform thickness and width, which reduces the terminal effect from changing the intended spacing of adjacent conductive traces 106 due to reduction in the gap therebetween.

Once the conductive traces 106 are formed during the electroplating process, the plating electrodes 120 are separated from the conductive traces 106 forming the circuit 104. For example, the conductive traces 106 may be cut along the interface between the circuit area 124 and the sacrificial area 126. Optionally, the conductive traces 106 may be laser cut however the conductive traces 106 may be severed by other tools such as a knife or a scriber to physically separate the conductive traces 106 in the circuit area 124 from the conductive traces 106 in the sacrificial area 126. In an exemplary embodiment, the shorting bars 142 are also removed, such as by laser cutting the shorting bars or by removing the shorting bars 142 by other processes.

Once the conductive traces are separated, the conductive traces 106 and the sacrificial area 126 may be removed from the substrate 102. For example, the substrate 102 may be immersed in, or sprayed with, a mild alkali solution to dissolve the lift-off layer 130. As the lift-off layer 130 dissolves, the conductive traces 106 formed on the lift-off layer 130 are also washed away and removed from the substrate 102. The circuit 104 remains intact on the substrate 102. The finished circuit pattern is adhered well to the substrate 102 because the acid based plating process does not degrade the seed layer 132, as is typical of electroless plating where the substrate is immersed in a bath having a high pH, which tends to degrade the binder of many inks used for the seed layer 132. Adhesion of conductive traces formed by electroless plating is problematic and can lead to the conductive traces 106 falling off the substrate 102. The conductive traces 106 formed by the electroplating process do not have adhesion problems.

Figure 4:
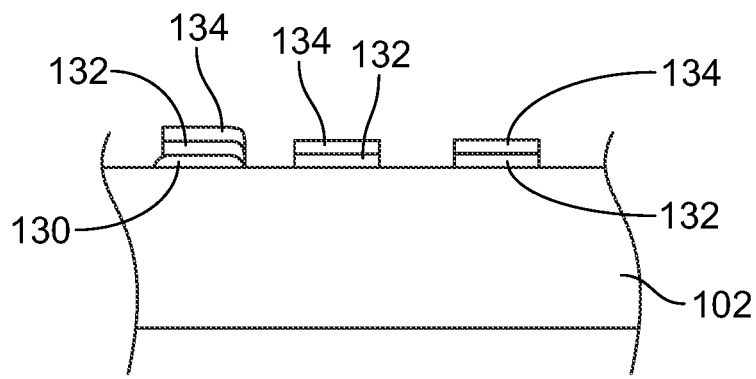
FIG. 4 is a cross sectional view of a portion of the electrical component during manufacture.

FIG. 4 is a cross sectional view of a portion of the electrical component 100 showing the seed layer 132 and the plating layer 134 in the circuit area 124 separated from the seed layer 132 and the plating layer 134 in the sacrificial area 126.

Figure 5:
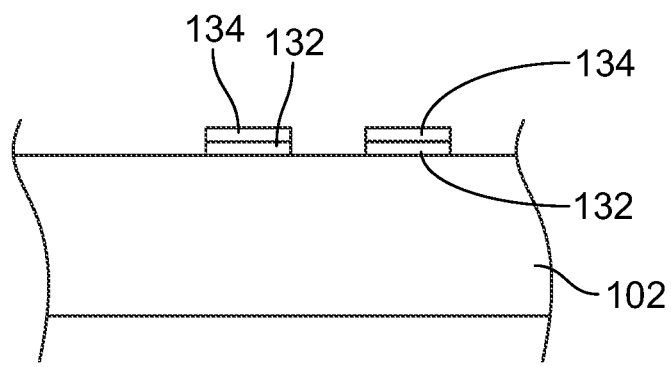
FIG. 5 is a cross sectional view of the electrical component during manufacture.

FIG. 5 is a cross sectional view of the electrical component 100 after the lift-off layer 130 and corresponding seed layer 132 and plating layer 134 (all shown in FIG. 4) are removed from the substrate 102. The conductive traces 106 forming the circuit 104 remain adhered to the substrate 102 and are shown in FIG. 5.

Figure 6:
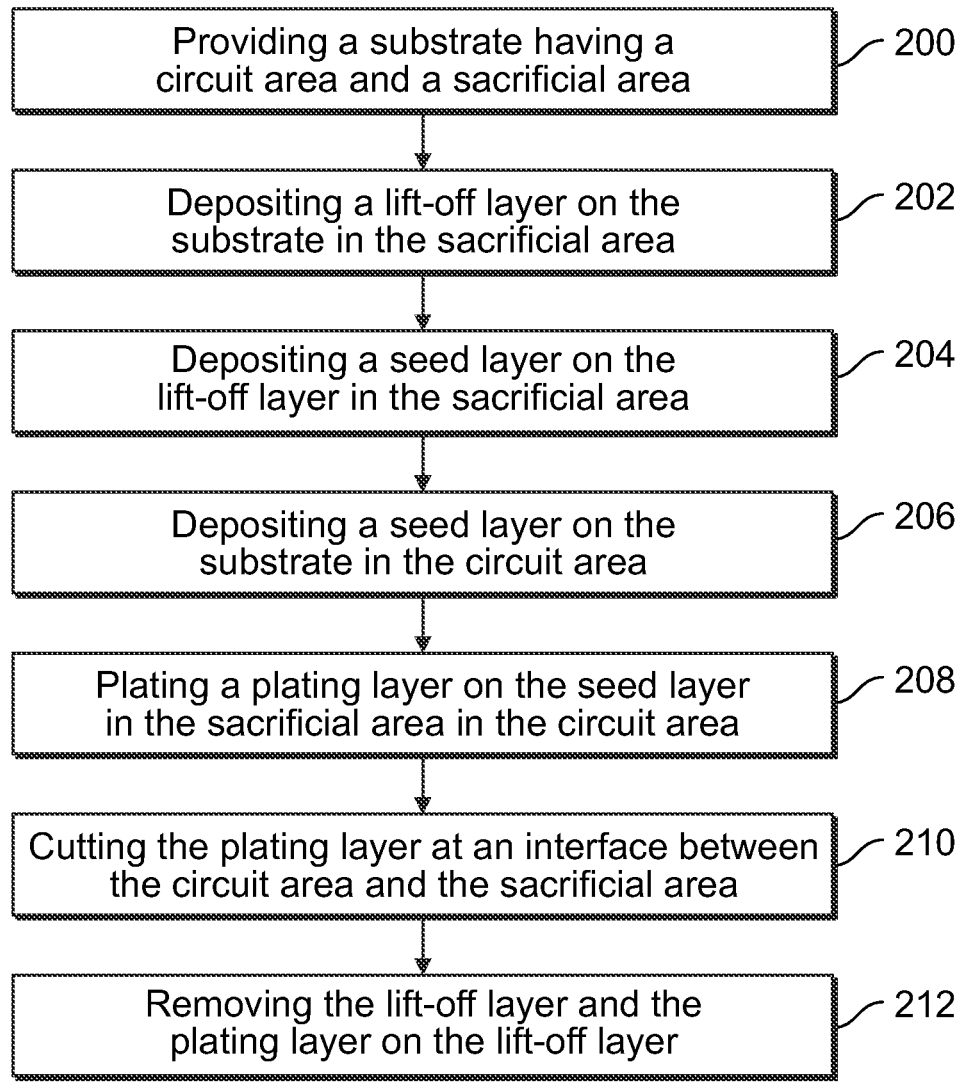
FIG. 6 illustrates a method of manufacturing an electrical component.

FIG. 6 illustrates a method of manufacturing an electrical component. The method includes providing 200 a substrate having a circuit area and a sacrificial area. The substrate may be any structure on which a circuit or conductive trace is to be deposited. For example, the substrate may be a rigid board, a flexible film, a casing or housing of a component such as an electronic device such as a phone, tablet, computer, GPS device, and the like. The substrate may be a metal structure, such as a heat sink or other structure used for manufacturing a metal clad circuit board. The circuit area and sacrificial area may be general areas of the substrate and do not necessarily have different characteristics.

The method includes depositing 202 a lift-off layer on the substrate in the sacrificial area. The lift-off layer is a layer that can be readily removed at a later time. For example, the lift-off layer may be a material that can be dissolved, such as in a chemical bath. In other embodiments, the lift-off layer may be a material that is easily removed, such as when subject to a temperature change, such as when heated to a melting point. Optionally, the lift-off layer may be an etch stop material. The lift-off layer may be deposited by printing the lift-off layer on the substrate.

The method includes depositing 204 a seed layer on the lift-off layer in the sacrificial area. The seed layer may be a conductive seed layer. The seed layer may be a conductive ink. The seed layer may be deposited by printing the seed layer in a predetermined pattern. The seed layer may be a material that is readily plated, such as when subjected to an electroplating process.

The method includes depositing 206 a seed layer on the substrate in the circuit area. The seed layer in the circuit area may be continuous from the seed layer in the sacrificial area to conduct current along the entire seed layer from the sacrificial area to the circuit area. Optionally, depositing a seed layer in the circuit area may include depositing the seed layer in loops with shorting paths between the loops. Optionally, the seed layer may include shorting paths between the loops. The seed layer may be a conductive seed layer. The seed layer may be a conductive ink. The seed layer may be deposited by printing the seed layer in a predetermined pattern. The seed layer may be a material that is readily plated, such as when subjected to an electroplating process.

The method includes plating 208 a plating layer on the seed layer in the sacrificial area and the circuit area. The plating may be applied by electroplating in an electrolytic bath. The plating layer covers the seed layer in both the sacrificial area and the circuit area. The plating layer forms conductive traces. The plating layer in the circuit area forms a circuit, such as an antenna circuit or a circuit of a circuit board. The plating layer may form shorting bars on the shorting paths to allow simultaneous plating of each of the loops, such as to reduce terminal effect.

The method includes cutting 210 the plating layer at an interface between the circuit area and the sacrificial area. Cutting the plating layer may include laser cutting the plating layer. The shorting bars may likewise be cut or separated to separate the loops or other conductive paths not necessary for the final product but useful to more evenly plate the circuit. Separating the conductive traces of the plating layer in the sacrificial area from the conductive traces of the plating layer in the circuit layer allows for easier removal of the lift-off layer and the corresponding plating layer in the sacrificial area without damaging the plating layer in the circuit area.

The method includes removing 212 the lift-off layer and the plating layer on the lift-off layer without removing the plating layer in the circuit area. For example, an alkali solution may be applied to the lift-off layer to dissolve the lift-off layer. The electrical component may be bathed in an alkali bath, where the alkali bath dissolves the lift-off layer to remove the plating layer on the lift-off layer. The lift-off layer may be removed by other processes in alternative embodiments.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means—plus-function format and are not intended to be interpreted based on 35 U.S.C. §112, sixth paragraph, unless and until such claim limitations expressly use the phrase "means for" followed by a statement of function void of further structure.

What is claimed is:

1. An electrical component comprising:
a substrate having a circuit area and a sacrificial area;
a lift-off layer deposited on the substrate in the sacrificial area;
a seed layer deposited on the substrate in the circuit area and deposited on the lift-off layer in the sacrificial area; and
a plating layer electrodeposited on the seed layer, the plating layer forming a circuit in the circuit area, the plating layer forming plating electrodes on the lift-off layer in the sacrificial area;
wherein the lift-off layer is removable from the substrate, the seed layer and the plating layer on the lift-off layer being removed with the lift-off layer to entirely remove the plating electrodes when the lift-off layer is removed from the substrate leaving behind only the circuit on the substrate.

2. The electrical component of claim 1, wherein the lift-off layer is an etch stop material configured to be removed in an alkaline bath.

3. The electrical component of claim 1, wherein the plating layer is laser cut along the interface between the circuit area and the sacrificial area.

4. The electrical component of claim 1, wherein the lift-off layer is printed on the substrate.

5. The electrical component of claim 1, wherein the seed layer is printed on the lift-off layer and on the substrate.

6. The electrical component of claim 1, wherein the plating layer is plated on the seed layer in an electrolytic bath.

7. The electrical component of claim 1, wherein the circuit forms an antenna on the substrate.

8. The electrical component of claim 1, wherein the seed layer is deposited in loops, the seed layer having shorting paths between the loops, the plating layer being deposited on the shorting paths to form shorting bars during electroplating, the shorting bars being removed after the plating layer is deposited on the seed layer.

9. The electrical component of claim 1, wherein the lift-off layer is dissolved after the plating layer is formed, the plating layer deposited on the lift-off layer being removed as the lift-off layer is dissolved.

10. A method of manufacturing an electrical component comprising:
providing a substrate having a circuit area and a sacrificial area;
depositing a lift-off layer on the substrate in the sacrificial area;
depositing a seed layer on the lift-off layer in the sacrificial area;
depositing a seed layer on the substrate in the circuit area;
plating a plating layer on the seed layer in the sacrificial area and the circuit area, the seed layer and plating layer in the sacrificial area forming plating electrodes; and
removing the lift-off layer and the plating layer on the lift-off layer without removing the plating layer in the circuit area such that the entire plating electrodes are removed from the substrate.

11. The method of claim 10, wherein said removing the lift-off layer comprises applying an alkali solution to the lift-off layer to dissolve the lift-off layer.

12. The method of claim 10, wherein said removing the lift-off layer comprises bathing the electrical component in an alkali bath, the alkali bath dissolving the lift-off layer to remove the plating layer on the lift-off layer.

13. The method of claim 10, wherein said depositing a seed layer comprises printing the seed layer.

14. The method of claim 10, wherein said plating a plating layer comprises electroplating the plating layer in an electrolytic bath.

15. The method of claim 10, wherein said depositing a lift-off layer comprises depositing an etch stop material on the substrate in the sacrificial area.

16. The method of claim 10, wherein said depositing a lift-off layer comprises printing the lift-off layer on the substrate.

17. The method of claim 10, further comprising cutting the plating layer at an interface between the circuit area and the sacrificial area.

18. The method of claim 17, wherein said cutting the plating layer comprises laser cutting the plating layer.

19. The method of claim 10, wherein said depositing a seed layer in the circuit area comprises depositing the seed layer in loops with shorting paths between the loops, said plating the plating layer comprises plating the loops and the shorting paths to form shorting bars.

20. The method of claim 19, further comprising removing the shorting bars.

* * * * *